United States Patent
Yamamoto et al.

(10) Patent No.: US 10,050,644 B2
(45) Date of Patent: Aug. 14, 2018

(54) RECEIVER, WIRELESS COMMUNICATION SYSTEM, AND WIRELESS COMMUNICATION METHOD

(71) Applicant: Hitachi Kokusai Electric Inc., Tokyo (JP)

(72) Inventors: Keisuke Yamamoto, Tokyo (JP); Takashi Yano, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 15/561,806

(22) PCT Filed: Feb. 19, 2016

(86) PCT No.: PCT/JP2016/054847
§ 371 (c)(1),
(2) Date: Sep. 26, 2017

(87) PCT Pub. No.: WO2016/170832
PCT Pub. Date: Oct. 27, 2016

(65) Prior Publication Data
US 2018/0131393 A1    May 10, 2018

(30) Foreign Application Priority Data

Apr. 22, 2015 (JP) ................. 2015-087629

(51) Int. Cl.
*H03M 7/00* (2006.01)
*H03M 13/27* (2006.01)
(Continued)

(52) U.S. Cl.
CPC ..... *H03M 13/2796* (2013.01); *H03M 13/015* (2013.01); *H03M 13/45* (2013.01); *H04L 1/005* (2013.01); *H01Q 1/00* (2013.01)

(58) Field of Classification Search
CPC ........... H03M 13/2796; H03M 13/051; H03M 13/27; H03M 13/01; H03M 13/45; H04L 1/005; H04L 1/00; H01Q 1/00
(Continued)

(56) References Cited

U.S. PATENT DOCUMENTS 6,845,482 B2 * 1/2005 Yao ................. H03M 13/2714
714/755
7,570,700 B2 * 8/2009 Cameron ........... H03M 13/151
375/265

(Continued)

FOREIGN PATENT DOCUMENTS

JP    2009-540639 A    11/2009
JP    2013-207381 A    10/2013
JP    2015-50541 A     3/2015

OTHER PUBLICATIONS

International Search Report from International Application No. PCT/JP2016/054847 dated Apr. 5, 2016.

*Primary Examiner* — Jean B Jeanglaude
(74) *Attorney, Agent, or Firm* — Brundidge & Stanger, P.C.

(57) ABSTRACT

A wireless communication technique in which information that has been encoded and interleaved (the sequence of bits has been rearranged) on the transmission side is subjected to iterative decoding processing by using a demodulator, a deinterleaver, a decoder, and an interleaver on the receiving side.

11 Claims, 11 Drawing Sheets

(51) Int. Cl.
*H03M 13/45* (2006.01)
*H03M 13/01* (2006.01)
*H04L 1/00* (2006.01)
*H01Q 1/00* (2006.01)

(58) Field of Classification Search
USPC .............................................. 341/50, 51, 81
See application file for complete search history.

(56) References Cited

U.S. PATENT DOCUMENTS

| | | | |
|---|---|---|---|
| 8,873,620 B2* | 10/2014 | Citta .................... | H03M 13/00 375/240.01 |
| 2002/0061071 A1* | 5/2002 | Cameron ............ | H03M 13/151 375/295 |
| 2004/0001564 A1* | 1/2004 | Chan ....................... | H04L 1/005 375/341 |
| 2005/0022090 A1* | 1/2005 | Cameron ............ | H03M 13/151 714/755 |
| 2008/0043878 A1* | 2/2008 | Cameron ............ | H03M 13/151 375/295 |
| 2009/0213954 A1* | 8/2009 | Bursalioglu .......... | H04L 1/0631 375/262 |

\* cited by examiner

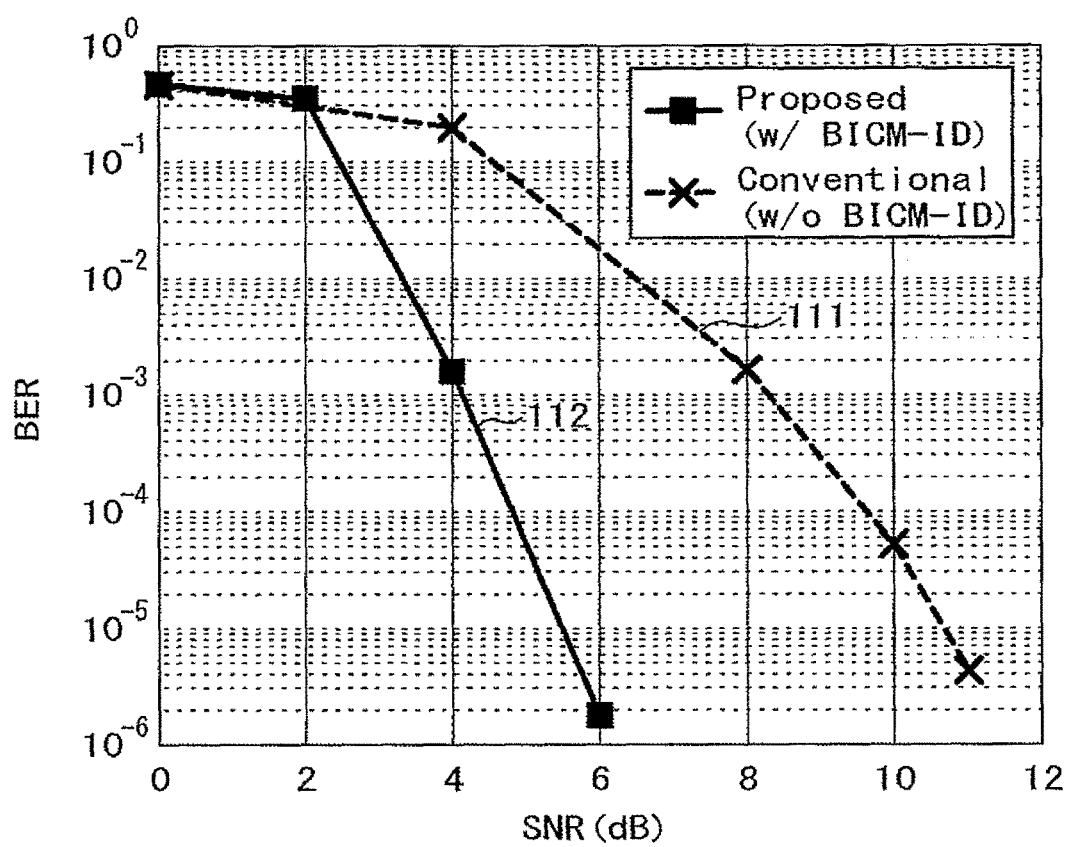

RECEIVER, WIRELESS COMMUNICATION SYSTEM, AND WIRELESS COMMUNICATION METHOD

TECHNICAL FIELD

The present invention relates to a wireless communication technique in which information that has been encoded and interleaved (the sequence of bits has been rearranged) on the transmission side is subjected to iterative decoding processing by using a demodulator, a deinterleaver, a decoder, and an interleaver on the receiving side.

BACKGROUND ART

BICM-ID (Iterative decoding processing: Bit Interleaved Coded Modulation with Iterative Decoding) method is a method in which a demodulator and a decoder perform iterative decoding through interleave processing that randomly rearranges the sequence of information bits, and deinterleave processing that returns the sequence of information bits, thereby performing MAP (Maximum a posteriori probability) decoding.

In recent years, there is proposed a technique for analyzing the convergence of iterative decoding processing, which is called EXIT (Extrinsic Information Transfer) analysis. The following becomes clear. In other words, even when each of an encoding method and a modulation method in the BICM-ID is not superior in single-body characteristics, the encoding method and the modulation method exhibit excellent decoding characteristics as a whole by properly matching both of the methods to each other.

Patent literature 1 discloses a method in which extended mapping that assigns bits, the number of which is greater than the number of bits that can be originally mapped, is combined with iterative encoding to achieve excellent characteristics. Patent literature 2 discloses a method that uses regular extended mapping in which while extended mapping is provided with certain regularity to reduce the computation amount, the extended mapping is matched to iterative encoding, thereby enabling to achieve excellent characteristics.

In these BIDM-ID methods, in general, bit likelihood information is exchanged between a demodulator and a decoder to perform iterative decoding processing. Therefore, interleave processing that randomly rearranges the sequence of bits between the demodulator and the decoder, and deinterleave processing, are performed in units of blocks into which a fixed number of bits of bit likelihood information are collectively grouped. The demodulator and the decoder subject bit likelihood information of the same block to demodulation processing and decoding processing respectively.

Meanwhile, with respect to wireless communication methods, as shown in non-patent literature 1 and non-patent literature 2, there is a method in which block-type interleaving and convolutional interleaving are used in combination as interleave processing

CITATION LIST

Patent Literature

Patent Literature 1: Japanese Unexamined Patent Application Publication No. 2020224367

Patent Literature 2: Japanese Unexamined Patent Application Publication No. 2020240397

Non Patent Literature

Non Patent literature 1: ARIBSTD-B33
Non Patent literature 2: ARIBSTD-B57

SUMMARY OF INVENTION

Technical Problem

In the methods of non-patent literature 1 and non-patent literature 2, interleave processing is performed by using convolutional interleaving as bit interleaving, and by using, in combination, block-type random interleaving that rearranges the sequence in units of symbols, a plurality of bits being put together into each symbol. Such a method has an advantage that when iterative decoding processing is not used, bit interleaving can be carried out by a simple configuration. However, when the method is applied to BICM-ID processing, the rearrangement of the sequence of bits by convolutional interleaving is not closed in a single block in which symbol interleaving is performed, but is performed across a plurality of blocks, and therefore a difference occurs between a group of bit likelihood information handled by the demodulator and a group of bit likelihood information handled by the decoder.

In order to achieve ideal characteristics in the iterative decoding processing used in BICM-ID, it is necessary to perform processing in units of blocks that include all bit likelihood information handled by the demodulator and the decoder (in units of blocks used for interleaving). Therefore, when groups of bit likelihood information treated by the demodulator and the decoder differ from each other, the demodulator and the decoder both require a block having an infinite length as a unit of block that includes all bit likelihood information, which is not realistic.

A problem to be solved by the present invention is that in such a wireless communication method that convolutional interleaving and block interleaving are used in combination, in other words, in a wireless communication method in which the sequence of bits is rearranged across blocks used for symbol interleaving, when a demodulator and a decoder perform iterative decoding processing by exchanging bit likelihood information, a block that includes bit likelihood information handled by the demodulator differs from a block that includes bit likelihood information handled by the decoder, and therefore it is difficult to prepare bit likelihood information required for the iterative decoding processing. In other words, it is difficult to apply BICM-ID processing to the wireless communication method in which the sequence of bits is rearranged across blocks used for symbol interleaving.

Therefore, an object of the present invention is to enable to apply BICM-ID processing to the wireless communication method in which the sequence of bits is rearranged across blocks used for symbol interleaving.

Solution to Problem

Although the present application includes a plurality of means for solving the above-described problem, a representative configuration of a receiver according to the present invention is as follows. That is to say, a receiver for receiving a wireless signal that has been encoded, subsequently has been subjected to first interleave processing including symbol interleave processing that rearranges a sequence of a plurality of symbols, and has been modulated and transmitted in units of symbols, a sequence of bits being rearranged, in the first interleave processing, across blocks in which the symbol interleave processing is performed, the receiver including: a demodulator that performs demodulation processing of the wireless signal by using a priori information, and outputs first bit information; a deinterleaver that subjects the first bit information to deinterleave processing that returns the sequence of bits rearranged by the first interleave processing to an original state, and outputs second bit information;

a decoder that decodes the second bit information, and outputs third bit information; and an interleaver that subjects the third bit information to second interleave processing that is processing reverse to the deinterleave processing, and outputs fourth bit information, wherein iterative decoding processing is performed by inputting the fourth bit information into the demodulator as the priori information, and when the iterative decoding processing is performed, bit information of finite-length blocks is used, the finite-length blocks including at least respective blocks immediately before and after a result obtaining target block that is a target for obtaining a result of the iterative decoding processing.

In addition, a representative configuration of a wireless communication system according to the present invention is as follows. That is to say, a wireless communication system including: a transmitter that transmits a wireless signal; and a receiver that receives the wireless signal transmitted from the transmitter, the transmitter encoding bit information to be transmitted, subsequently performing first interleave processing that includes symbol interleave processing that rearranges a sequence of a plurality of symbols in one block, and bit interleave processing that rearranges a sequence of bits across the blocks, and modulating a wireless signal in units of symbols to transmit the wireless signal, the receiver including: a demodulator that performs demodulation processing of the wireless signal by using a priori information, and outputs first bit information; a deinterleaver that subjects the first bit information to deinterleave processing that returns the sequence of bits rearranged by the first interleave processing to an original state, and outputs second bit information; a decoder that decodes the second bit information, and outputs third bit information; and an interleaver that subjects the third bit information to second interleave processing that is processing reverse to the deinterleave processing, and outputs fourth bit information, wherein iterative decoding processing is performed by inputting the fourth bit information into the demodulator as the priori information, and when the iterative decoding processing is performed, bit information of finite-length blocks is used, the finite-length blocks including at least respective blocks immediately before and after a result obtaining target block that is a target for obtaining a result of the iterative decoding processing.

In addition, a representative configuration of a wireless communication method according to the present invention is as follows. That is to say, a wireless communication method including: a step for, after encoding, performing first interleave processing that includes symbol interleave processing that rearranges a sequence of a plurality of symbols and bit interleave processing that rearranges a sequence of bits across blocks at the time of the symbol interleave processing, and modulating a wireless signal in units of symbols to transmit the wireless signal; a demodulation step for performing demodulation processing of the wireless signal by using a priori information, and outputting first bit information; a deinterleave processing step for subjecting the first bit information to deinterleave processing that returns the sequence of bits rearranged by the first interleave processing to an original state, and outputting second bit information; a decoding step for decoding the second bit information, and outputting third bit information; and a second interleave processing step for subjecting the third bit information to second interleave processing that is processing reverse to the deinterleave processing, and outputting fourth bit information, wherein iterative decoding processing is performed by using the fourth bit information in the demodulation step as the priori information, and when the iterative decoding processing is performed, bit information of finite-length blocks is used, the finite-length blocks including at least respective blocks immediately before and after a result obtaining target block that is a target for obtaining a result of the iterative decoding processing.

Advantageous Effects of Invention

According to the above-described configuration, BICM-ID processing can be applied to a wireless communication method in which the sequence of bits is rearranged across blocks used for symbol interleaving, for example, to a wireless communication method that uses convolutional interleaving and block interleaving in combination.

BRIEF DESCRIPTION OF DRAWINGS

FIG. 11 is a graph illustrating bit error rate characteristics.

DESCRIPTION OF EMBODIMENTS

An embodiment of the present invention will be described below with reference to the drawings.

Figure 1:
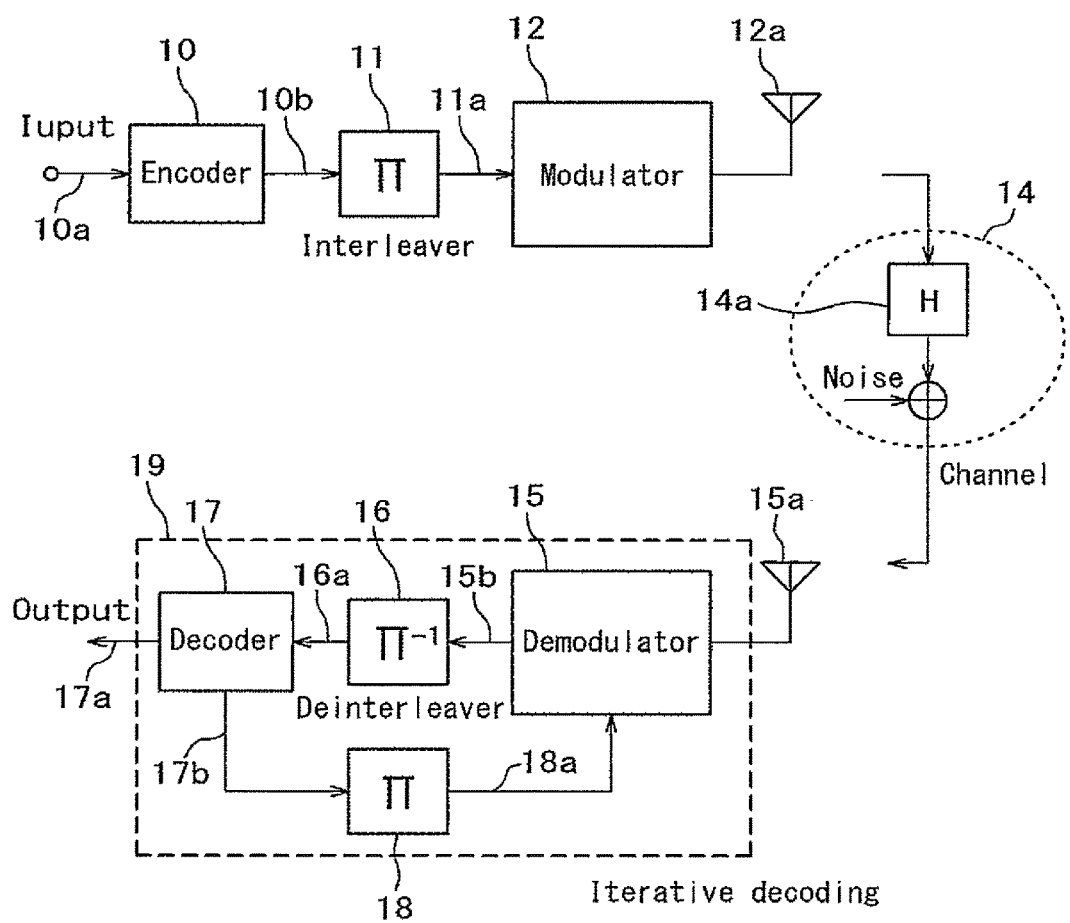
FIG. 1 is a diagram illustrating a configuration of a wireless communication system according to an embodiment of the present invention.

FIG. 1 is a diagram illustrating a configuration of a wireless communication system, in other words, a basic configuration that includes a transmitter and a receiver, each of which uses BICM-ID, according to the embodiment of the present invention. The transmitter is configured to include an encoder 10, an interleaver 11 that randomly rearranges the sequence of information bits, a modulator 12, and an antenna 12a. The interleaver 11 is configured to include a convolutional interleaver 20, and a block interleaver 23, which will be described later. Such a configuration of the transmitter is publicly known.

The receiver is configured to include an antenna 15a, a demodulator 15, a deinterleaver 16 that returns the sequence of information bits to the original sequence, a decoder 17, and an interleaver 18. A configuration of the interleaver 18 is the same as that of the interleaver 11. The deinterleaver 16 performs the operation reverse to that of the interleaver 18, in other words, returns the sequence of information bits rearranged by the interleaver 11 or the interleaver 18. The deinterleaver 16 is configured to include a block deinterleaver 30, and a convolutional deinterleaver 31, which will be described later.

A signal wirelessly transmitted by the antenna 12a of the transmitter (modulator 12) is received by the antenna 15a of the receiver (demodulator 15) through a wireless channel, in other words, a wireless propagation path 14. Channel information 14a that indicates a state of the wireless propagation path 14 and noises are reflected on the received signal received by the receiver.

In the transmitter, the encoder 10 encodes a predetermined set of input bit information 10a (for example, the number of bits g), and then outputs the encoded information to the interleaver 11 as bit information 10b (for example, the number of bits h). The interleaver 11 performs interleave processing that randomly rearranges the bit sequence of encoded code word bits (bit information 10b) to generate bit information 11a, and then outputs the bit information 11a to the modulator 12. The modulator 12 performs modulation processing based on the wireless propagation path 14, and outputs a modulated signal from the antenna 12a in units of transmission symbols.

More specifically, the interleaver 11 subjects the encoded bit information 10b to interleave processing including symbol interleaving processing that rearranges the sequence of a plurality of symbols, and then outputs the bit information 11a. As described below, in this interleave processing, the sequence of bits is rearranged across blocks used for symbol interleave processing. The modulator 12 modulates the bit information 11a in units of symbols, and then transmits the modulated wireless signal.

For example, as a modulator corresponding to the modulator 12 shown in FIG. 1, usual modulation such as QAM (Quadrature Amplitude Modulation), ASK (Amplitude Shift Keying), PSK (Phase Shift Keying), and FSK (Frequency Shift Keying) can be used according to SNR (signal to Noise Ratio). The modulator 12 subjects a signal of the input bit information 11a to multi-level modulation in units of symbols (for example, 64-value modulation for each 6 bits) by use of, for example, PSK, and then outputs a transmission signal from the antenna 12a in units of transmission symbols.

In the receiver, the demodulator 15 subjects a received signal (received symbol) input from the antenna 15a to demodulation processing, and outputs bit information 15b (first extrinsic information) to the deinterleaver 16. The deinterleaver 16 temporarily stores a bit likelihood signal corresponding to all code word bits (bit information 11a) that have been encoded and interleaved on the transmission side, performs deinterleave processing that returns, to the original state, the sequence of bit strings rearranged by the interleaver 11 on the transmission side, and outputs bit information 16a (second extrinsic information) to the decoder 17. The decoder 17 decodes the bit information 16a, and outputs bit information 17b (third extrinsic information). The interleaver 18 subjects the bit information 17b to interleave processing, and supplies bit information 18a (fourth extrinsic information) to the demodulator 15. The demodulator 15 performs demodulation processing again by using, as a priori information, the bit information 18a (fourth extrinsic information) based on the information from the decoder 17, and outputs the demodulation result, the accuracy of which is higher.

In this manner, an iterative decoding processing unit 19 is configured from the demodulator 15, the deinterleaver 16, the decoder 17, and the interleaver 18. In the BICM-ID, the iterative decoding processing unit 19 iteratively performs the iterative decoding processing, maximizes the posteriori probability of an obtained signal, and subsequently obtains final decoder output 17a (corresponding to the bit information 10a of input on the transmission side).

It is common practice to use a bitwise log likelihood ratio (LLR: Log Likelihood Ratio) as the bit information exchanged between the demodulator 15 and the decoder 17. LLR is a logarithmic expression of a ratio between the probability that the bit is 0 and the probability that the bit is 1, and can be represented by the following (formula 1). In the (formula 1), P (b=0) means the probability that b is 0, and P (b=1) means the probability that b is 1.

$$L(b) = \log\frac{P(b=0)}{P(b=1)} \qquad \text{[Formula 1]}$$

Figure 2:
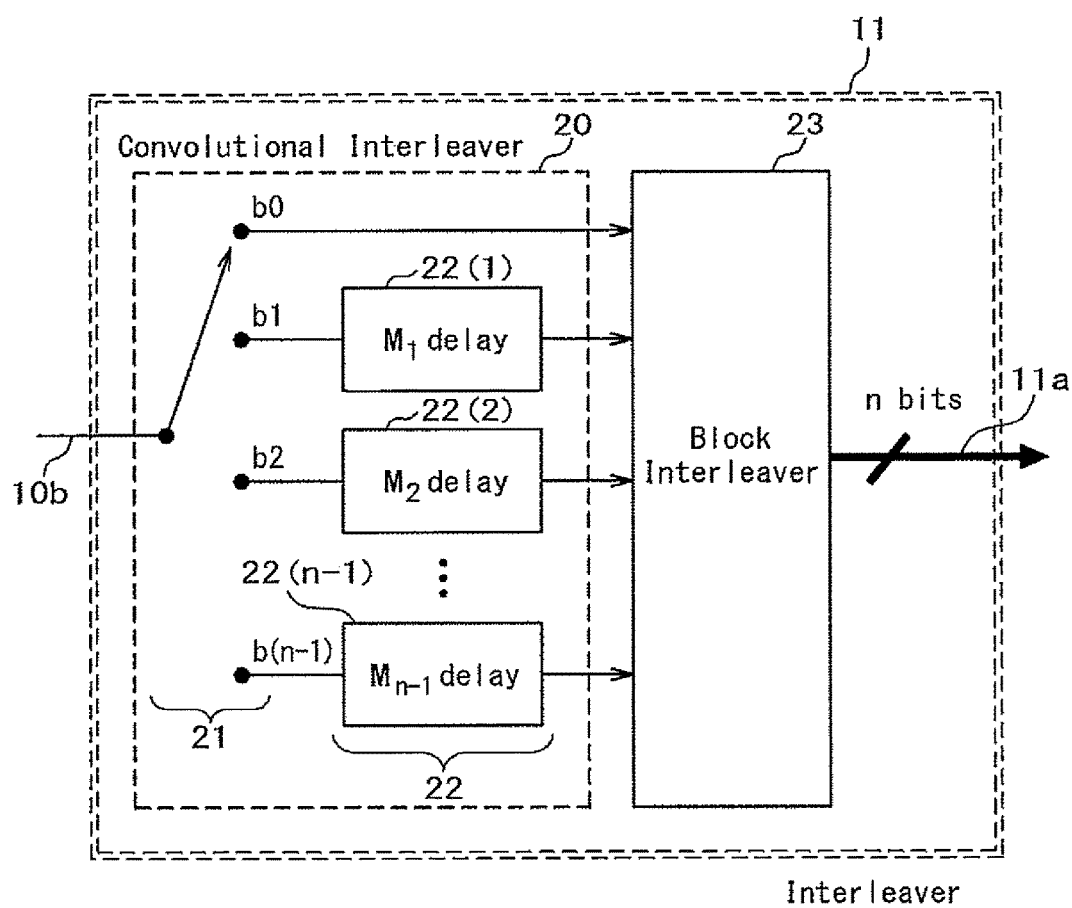
FIG. 2 is a diagram illustrating a configuration of an interleaver according to the embodiment of the present invention.

FIG. 2 is a diagram illustrating a configuration of an interleaver according to the embodiment of the present invention. As shown in FIG. 2, in the present embodiment, the interleaver 11 is configured to include the convolutional interleaver 20, and the block interleaver 23. It should be noted that the same function as that of the interleaver 11 may be realized by an interleaver having a different configuration. The configuration of the interleaver 18 is also the same as that of the interleaver 11.

The convolutional interleaver 20 is configured to include a serial/parallel converter 21, and at least one delay device 22. The serial/parallel converter 21 subjects the bit information 10b input into the convolutional interleaver 20 to serial/parallel conversion in units of symbols. In the example shown in FIG. 2, the serial/parallel converter 21 parallel-converts n pieces of bit information (b0 to b(n−1)), which is equivalent to one symbol, among the pieces of bit information 10b, and maintains the converted bit information until bit information of the next symbol is input. For example, the bit b1 (the second bit of the symbol) of the parallel output is output when the bit b1 has appeared as the bit information 10b of the serial input, and is maintained until the second bit of the next symbol appears.

The delay device 22 delays at least one bit of bit information that has been subjected to the serial/parallel conversion. In the example shown in FIG. 2, the delay device 22 is configured to include a delay device 22(1) corresponding to the bit b1, a delay device 22(2) corresponding to the bit b2, ..., and a delay device 22(n−1) corresponding to the bit b(n−1). For example, the delay device 22(1) delays the bit b1 by 50 bits, and the delay device 22(2) delays the bit b2 by 100 bits. As described below, at least one of the delay devices 22 provides a delay that is out of range of a plurality of symbols, the sequence of which is rearranged by the block interleaver 23. The delay devices 22(1) to 22(n−1) are generically represented as the delay device 22.

The bit b0 (the first bit of the symbol) does not have the delay device 22 inserted therein, and therefore the delay amount of the bit b0 is 0. The bit b1 has the delay device 22(1) inserted therein, the delay amount of which is M1, and therefore the delay amount of the bit b1 output from the convolutional interleaver 20 is M1. Similarly, the delay amount of the bit b2 is M2, and the delay amount of the bit b(n−1) is Mn−1.

Thus, the convolutional interleaver 20 subjects the input n bits (bit information equivalent to one symbol) to the serial/parallel conversion, and provides the plurality of bits (n bits) to be parallel-output with respective delay amounts that differ from one another, thereby performing bit interleave processing that rearranges the bit sequence of bit information equivalent to one symbol.

The block interleaver 23 is a symbol interleaver that stores the output from the convolutional interleaver 20, in other words, the output of the bits (n bits) equivalent to one symbol, by a plurality of symbols, and subsequently subjects bit information of the plurality of symbols, which have been stored, to interleaving in units of symbols. For example, the block interleaver 23 stores bit information equivalent to 4 symbols from the first to fourth symbols, and subsequently subjects bit information of the symbols, which have been stored, to interleaving in units of symbols, thereby rearranging the sequence of symbols in order of, for example, the third symbol, the first symbol, the fourth symbol, and the second symbol, and then serially outputting the bit information in this order.

For example, a case will be described where the bit information 10b (b0 to b95) is input into the interleaver 11, one symbol is composed of 6 bits (b0 to b5, b6 to b11, b12 to b17, b18 to b23, b24 to b29, b30 to b35, . . . ), the delay device 22(1) delays the second bit information (b1, b7, b13, b19, . . . ) by 20 bits, and the block interleaver 23 rearranges the sequence of bit information equivalent to 4 symbols in order of the third symbol, the first symbol, the fourth symbol, and the second symbol.

In this case, the convolutional interleaver 20 successively outputs the first symbol (b0, f, b2 to b5), the second symbol (b6, f, b8 to b11), the third symbol (b12, f, b14 to b17), the fourth symbol (b18, b1, b20 to b23), the fifth symbol (b24, b7, b31 to b29), the sixth symbol (b30, b13, b32 to b35), the seventh symbol (b36, b19, b38 to b41), the eighth symbol (b42, b25, b44 to b47), . . . in this order. However, with respect to this output, the second bit information f of the first to third symbols becomes bit information that does not exist in the bit information 10b (b0 to b95), and has been input before the bit information 10b (b0 to b95). Therefore, the second bit information f becomes an undefined or known signal at the time of the first transmission. In the case of the undefined signal, processing on the receiving side uses the erasure described below. In general, the number of pieces of transmitted bit information is sufficiently larger than the amount of delay of the interleaver and the block size of the block interleaver. Therefore, in many cases, the undefined bit information becomes a part of the whole bit information, and does not have a large influence on the efficiency of the communication system.

Therefore, at the time of the first-time output from the block interleaver 23, in other words, the first-time output from the interleaver 11, the sequence of the first to fourth symbols is rearranged, and the third symbol (b12, f, b14 to b17), the first symbol (b0, f, b2 to b5), the fourth symbol (b18, b1, b20 to b23), and the second symbol (b6, f, b8 to b11) are serially outputted in this order.

Next, at the time of the second-time output from the interleaver 11, the sequence of the fifth to eighth symbols is rearranged, and the seventh symbol (b36, b19, b38 to b41), the fifth symbol (b24, b7, b31 to b29), the eighth symbol (b42, b25, b44 to b47), and the sixth symbol (b30, b13, b32 to b35) are serially outputted in this order.

In this manner, the delay device 22 provides at least one bit of the bit information, which has been subjected to the serial/parallel conversion by the serial/parallel converter 21, with a delay that is out of range of the plurality of symbols, the sequence of which is rearranged by the block interleaver 23. That is to say, the delay device 22 provides a delay that is out of range of one block to be symbol-interleaved by the block interleaver 23. In other words, when symbol interleaving is performed by the block interleaver 23, a delay is provided in such a manner that the sequence of bits is rearranged across a plurality of blocks.

Thus, when symbol interleaving is performed by the block interleaver 23, the interleaver 11 rearranges the sequence of bits across a plurality of blocks.

Figure 3:
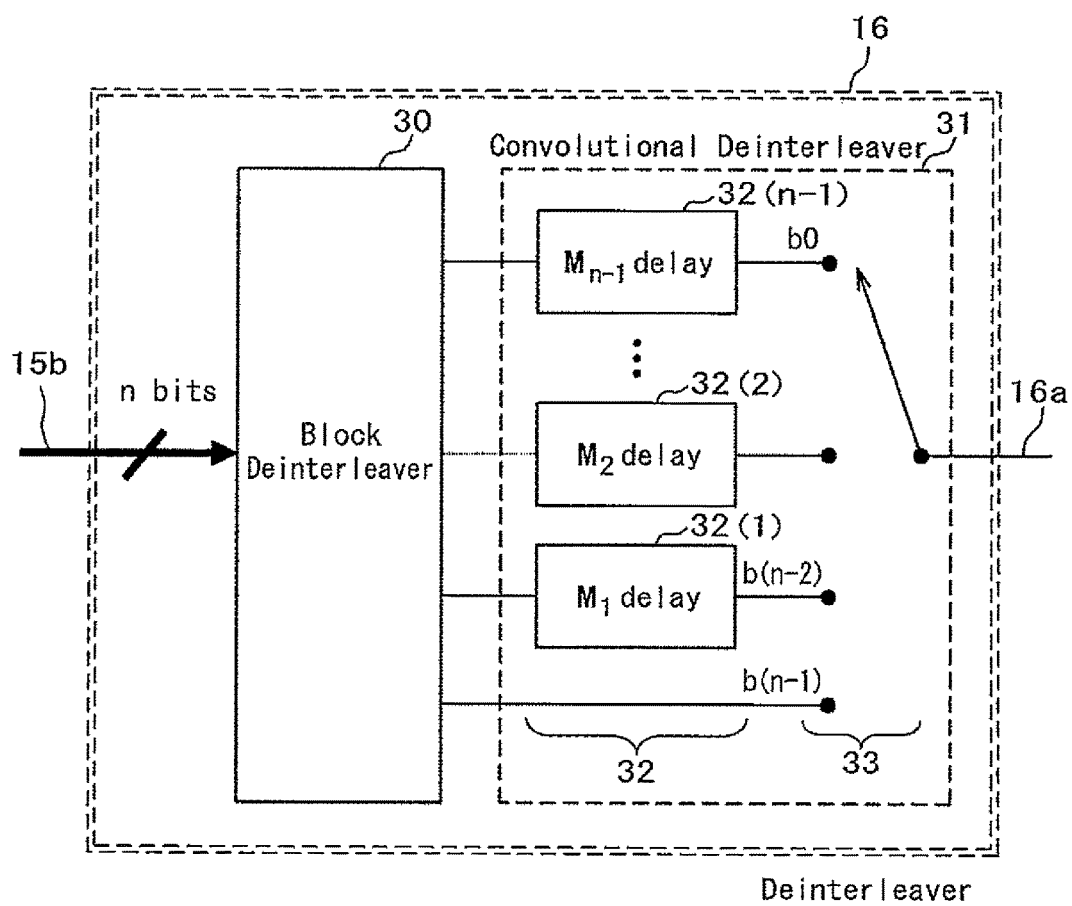
FIG. 3 is a diagram illustrating a configuration of a deinterleaver according to the embodiment of the present invention.

FIG. 3 is a diagram illustrating a configuration of a deinterleaver according to the embodiment of the present invention.

The deinterleaver 16 has a function reverse to that of the interleaver 11, in other words, a function of returning the sequence of bits, which have been rearranged across the plurality of blocks by the interleaver 11, to the original sequence (the sequence before the rearrangement by the interleaver 11).

As shown in FIG. 3, in the present embodiment, the deinterleaver 16 is configured to include the block deinterleaver 30, and the convolutional deinterleaver 31. The block deinterleaver 30 and the convolutional deinterleaver 31 perform the operations reverse to those of the above-described block interleaver 23 and the above-described convolutional interleaver 20 respectively. It should be noted that the same function as that of the deinterleaver 16 may be realized by a deinterleaver having a different configuration.

The block deinterleaver 30 subjects the bit information 15b, which is the symbol output from the demodulator 15, to the serial/parallel conversion, and subsequently returns the sequence to the sequence of symbols before the sequence is rearranged by the block interleaver 23. The convolutional deinterleaver 31 returns a delay of each bit, which is parallel-output from the block deinterleaver 30, to a state before the delay provided by the delay device 22 on the transmission side, thereby returning the sequence of bits to the sequence of bits before the bits are input into the interleaver 11 on the transmission side.

In this manner, the deinterleaver 16 is configured to include a symbol deinterleaver (that is to say, the block deinterleaver 30) that rearranges the sequence of symbols in the block, and returns the sequence of symbols to the original state, with respect to the output of the demodulator 15, and the convolutional deinterleaver 31 that subjects the output from the symbol deinterleaver to the parallel/serial conversion, and rearranges the sequence of bits, and returns the sequence of bits to the original state. As the result, the deinterleaver can be easily realized.

The convolutional deinterleaver 31 is configured to include a delay device 32 that delays at least one bit among bits that are parallel-output from the block deinterleaver 30, and a parallel/serial converter 33 that subjects the parallel output from the delay device 32 to serial conversion.

In the example shown in FIG. 3, the delay device 32 is configured to include a delay device 32(n−1) corresponding to the bit b0 (the first bit of the symbol), ..., a delay device 32(2) corresponding to the bit b(n−3), and a delay device 32(1) corresponding to the bit b(n−2). The bit b(n−3) is the (n−2)th bit of the symbol, and the bit b(n−2) is the (n−1)th bit of the symbol. The delay devices 32(n−1) ... 32(1) are generically represented as the delay device 32.

The delay device 32(n−1) provides the bit b0 with the delay amount M(n−1). The delay device 32(1) delays the bit b(n−2) by the delay amount M1. The bit b(n−1), which is the n-th bit of the symbol, is not delayed.

The delay device 32 offsets the delay amount of each bit that has been delayed by the delay device 22 on the transmission side. For example, the bit b0 (the first bit of the symbol) that has not been delayed by the delay device 22 on the transmission side is delayed by P0 that is the maximum delay amount. The b1 (the second bit of the symbol) that has been delayed by M1 by the delay device 22 on the transmission side is delayed by a delay amount of P1=(P0−M1). The b2 (the third bit of the symbol) that has been delayed by M2 by the delay device 22 on the transmission side is delayed by a delay amount of P2=(P0−M2). Thus, the delay device 32 returns the delay of each bit that is output from the block deinterleaver 30 to a state before the delay provided by the delay device 22 on the transmission side.

For example, when the delay amount M(n−1) is the maximum in the example shown in FIG. 2, the bit b0 (the first bit of the symbol), the delay amount of which is 0, is delayed by M(n−1) that is the maximum delay amount as shown in FIG. 3. The b1 (the second bit of the symbol) that has been delayed by M1 by the delay device 22 on the transmission side is delayed by a delay amount of (M(n−1)−M1). b(n−1) (the n-th bit of the symbol) that has been delayed by M(n−1) by the delay device 22 on the transmission side is delayed by a delay amount of (M(n−1)−M(n−1))=0.

The parallel/serial converter 33 subjects the parallel output from the delay device 32 to serial conversion, and returns the sequence of bits to the same sequence of bits as that of the bit information 10b before the bit information 10b is input into the interleaver 11 on the transmission side.

In this manner, the convolutional deinterleaver 31 is configured to be provided with the delay device 32 that delays at least one bit among bits that are parallel-output from the block deinterleaver 30, and the parallel/serial converter 33 that subjects the parallel output from the delay device 32 to the serial conversion. In addition, the delay device 32 is configured to return the sequence of bits that have been rearranged by the interleave processing on the transmission side. Therefore, the convolutional deinterleaver 31 can be easily realized.

Figure 4:
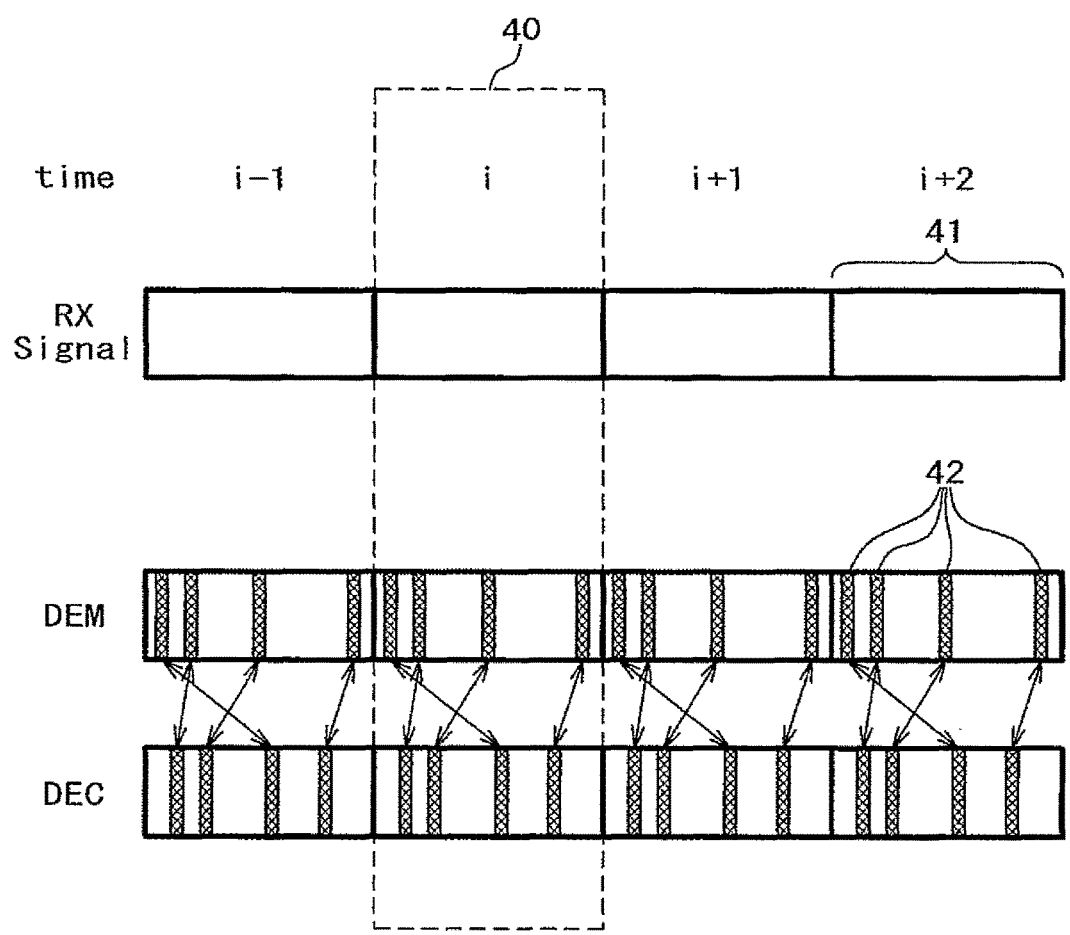
FIG. 4 is a drawing illustrating processing procedures of symbol interleave processing according to the embodiment of the present invention.

FIG. 4 is a drawing illustrating processing procedures of symbol interleave processing according to the embodiment of the present invention. FIG. 4 shows the relationship between symbol interleave processing and iterative decoding processing. In FIG. 4, a received signal (Rx Signal) is divided by a block 41 that is a unit of symbol interleaving performed by the block interleaver 23 of the interleaver 18, and the divided received signals are provided with respective indexes of i−1, ..., i+2, each indicating the time (Time). In addition, FIG. 4 shows the relationship among data 40 of the received signal that is subjected to iterative decoding processing at the time i, output data from the decoder (DEC) 17, which is used when the demodulator (DEM) 15 performs demodulation, and output data from the demodulator 15, which is used when the decoder 17 performs decoding.

Arrows in FIG. 4 show an example of symbols 42, the sequence of which is rearranged in the interleaver 18 (more specifically, the block interleaver 23) and the deinterleaver 16 (more specifically, the block deinterleaver 30). As shown in FIG. 4, viewing in units of symbols, the demodulator 15 and the decoder 17 exchange data (symbol) in the same block.

When all of data to be handled by the demodulator 15 and the decoder 17 exist in the same block, iterative decoding processing can be performed in units of one block. However, the validity of processing results based on the BICM-ID method is guaranteed when bits are randomly rearranged between the demodulator and the decoder. Therefore, it is necessary to consider exchanging of data not in units of symbols but in units of bits.

Figure 5:
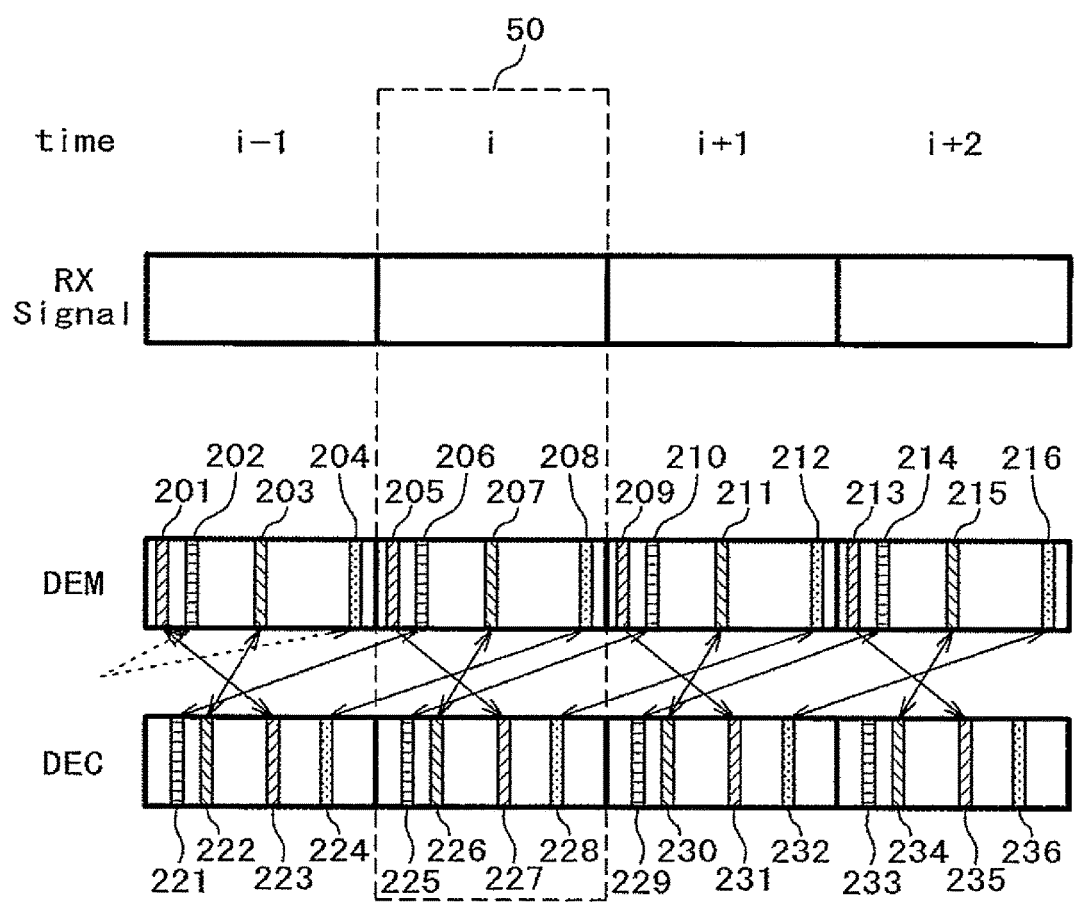
FIG. 5 is a drawing illustrating processing procedures of bit interleaving according to the embodiment of the present invention.

FIG. 5 is a drawing illustrating processing procedures of bit interleaving according to the embodiment of the present invention. FIG. 5 is a drawing illustrating the relationship between bit interleave processing and iterative decoding processing. The interleaver 18 according to the present embodiment is configured to include the convolutional interleaver 20 that rearranges the sequence of bits, and the block interleaver 23 that rearranges the sequence of symbols. Therefore, the rearrangement of the sequence of bits exchanged between the demodulator 15 and the decoder 17 is performed both for data in the same block, and for data across different blocks.

In the example shown in FIG. 5, the demodulator 15 handles data 201 to 204 at the time (i−1), handles data 205 to 208 at the time i, handles data 209 to 212 at the time (i+1), and handles data 213 to 216 at the time (i+2). In addition, the decoder 17 handles data 221 to 224 at the time (i−1), handles data 225 to 228 at the time i, handles data 229 to 232 at the time (i+1), and handles data 233 to 236 at the time (i+2).

In the example shown in FIG. 5, paying the attention to processing of data 50 that is subjected to iterative decoding processing at the time i, processing (processing of data 205 to 208) of the i block of the demodulator 15 requires bit information (data 221 and data 224) of the (i−1) block of the decoder 17, and bit information (data 226 and data 227) of the i block. Processing (processing of data 225 to 228) of the i block of decoder 17 requires bit information (data 205 and data 207) of the i block of demodulator 15, and bit information (data 210 and data 212) of the (i+1) block.

In addition, the obtainment of bit information (data 209 to 212) of the (i+1) block of the demodulator 15, in other words, processing (processing of data 209 to 212) of the (i+1) block of the demodulator 15, requires bit information (data 225 and data 228) of the i block of decoder 17, and bit information (data 230 and data 231) of the (i+1) block. Processing of the (i+1) block of the decoder 17 requires the bit information (data 209 and data 211) of the (i+1) block of the demodulator 15, and bit information (data 214 and data 216) of the (i+2) block.

Thus, in the present embodiment, pieces of bit information of all blocks are associated with one another, and therefore it is difficult to apply such a perfect BICM-ID method that all pieces of bit information related to the iterative processing are required.

First Example

Figure 6:
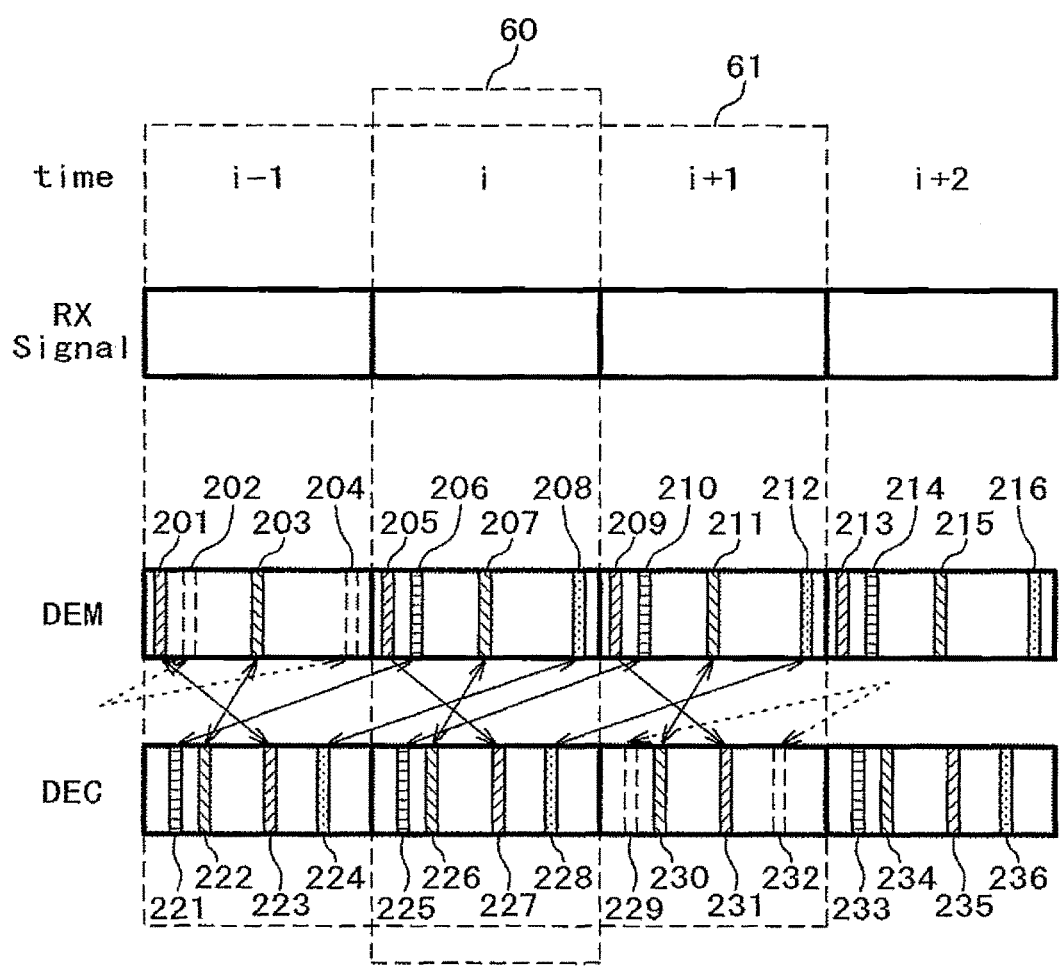
FIG. 6 is a drawing illustrating processing procedures of a BICM-ID method in a first example.
Figure 7:
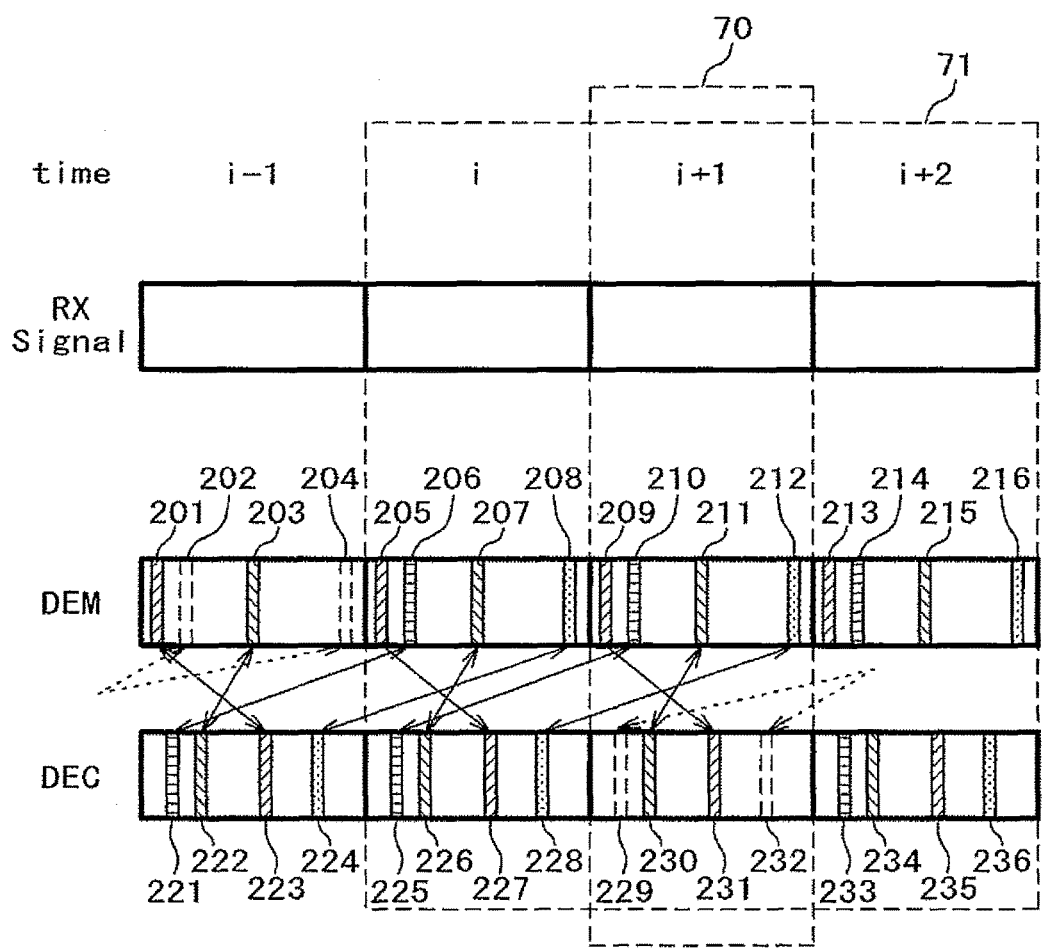
FIG. 7 is a drawing illustrating processing procedures of the BICM-ID method in the first example.

Accordingly, in order to solve the above-described problem, a first example of the present embodiment will be described with reference to FIGS. 6 and 7. FIGS. 6 and 7 are drawings each illustrating processing procedures of a BICM-ID method in the first example. FIG. 6 shows a case where a block 60 is targeted for obtaining the result (bit information) of iterative decoding processing; and FIG. 7 shows a case where a block 70 is targeted for obtaining the result (bit information) of iterative decoding processing.

In the first example, processing for obtaining bit information from the first block (the block at the first time) is performed, and subsequently processing for obtaining bit information from the next block is performed. In this manner, processing for obtaining bit information from each block is successively performed, and lastly, processing for obtaining bit information from the last block (the block at the last time) is performed. In the middle of the processing, processing for obtaining bit information from the block 60 at the time i (FIG. 6) is performed, and subsequently processing for obtaining bit information from the block 70 at the time (i+1) (FIG. 7) is performed.

As shown in FIG. 6, in the first example, after received signals at the time (i−1), the time i, and the time (i+1) are stored, one block (block 60) that is targeted for obtaining the result of iterative decoding processing is subjected to the iterative decoding processing by using bit information included in the block and in respective one blocks immediately before and after the block. In other words, a result obtaining target block 60 that is a target for obtaining the result (bit information) of the iterative decoding processing, and respective one blocks immediately before and after the result obtaining target block 60, are subjected to the iterative decoding processing.

In this case, bit information that is not included in the result obtaining target block 60 and in the respective one blocks immediately before and after the result obtaining target block 60 (bit information of blocks other than the block 60 and other than the respective one blocks immediately before and after the block 60) is not used for the iterative decoding processing. Reference numeral 61 in FIG. 6 shows three blocks composed of the block 60 and respective one blocks immediately before and after the block 60, in other words, blocks each containing data targeted for the iterative decoding processing (in other words, blocks that are subjected to the iterative decoding processing).

The result of iterative decoding processing of a received signal at the time i is obtained from the output of bit information included in the i block. However, in the iterative decoding processing, bit information of the block 61 is exchanged between the decoder 17 and the demodulator 15, the block 61 being composed of three blocks in total, the (i−1) block, the i block and the (i+1) block. When finite-length blocks are subjected to iterative decoding processing in this manner, data having no bit information (data 202, 204, 229, 232 shown in FIG. 6) partially emerges in blocks before and after the block 60 targeted for the iterative decoding processing.

It is preferable that a publicly-known erasure be used for such data having no bit information so as to prevent a large influence from being exerted on the processing result. For example, an erasure for bitwise information is a value indicating that the probability that a bit is 0 is equivalent to the probability that the bit is 1. When LLR represented by the above-described (formula 1) is used as bit information, a value of the erasure becomes 0. Incidentally, arbitrary data can also be used without using an erasure. However, in this case, it is hard to obtain a satisfactory result in comparison with the case where an erasure is used.

In the example shown in FIG. 6, first of all, receive data of the (i−1) block, the i block and the (i+1) block is stored, and the receive data is demodulated by the demodulator 15. Next, the respective results of demodulating the data of the (i−1) block, the i block, and the (i+1) block are output to the decoder 17, in this order, through the deinterleaver 16. In other words, deinterleave processing by the deinterleaver 16 is performed on a block basis, and the result is output to the decoder 17. In this case, with respect to the demodulation processing of the (i−1) block, the data 202, 204 do not exist in the bit information in the (i−1) block, and therefore erasures are used as the data 202, 204.

The decoder 17 performs decoding processing by using the results of demodulating the data of the (i−1) block, the i block, and the (i+1) block, the results having been obtained through the deinterleaver 16. Next, the respective results of decoding the data of the (i−1) block, the i block, and the (i+1) block are output to the demodulator 15, in this order, through the interleaver 18. In other words, interleave processing by the interleaver 18 is performed on a block basis, and the result is output to the demodulator 15. In this case, with respect to the decoding processing of the (i+1) block, the data 229, 232 do not exist in the bit information in the (i+1) block, and therefore erasures are used as the data 229, 232.

Next, the demodulator 15 performs demodulation processing by using the results of decoding the data of the (i−1) block, the i block, and the (i+1) block, the results having been obtained through the interleaver 18. Thus, after the iterative decoding processing is performed a plurality of times, bit information of the block 60 that is targeted for obtaining the result of the iterative decoding processing is obtained.

In this manner, after received signals at the time (i−1), the time i, and the time (i+1) are stored, one block 60 that is targeted for obtaining the result of iterative decoding processing is subjected to the iterative decoding processing by using bit information included in the block and in respective one blocks immediately before and after the block. Subsequently, as shown in FIG. 7, after received signals at the time i, the time (i+1), and the time (i+2) are stored, one block 70 that is targeted for obtaining the result of iterative decoding processing is subjected to the iterative decoding processing by using bit information included in the block and in respective one blocks immediately before and after the block.

While a block is shifted one by one, similar processing is successively performed up to the block at the last time. It should be noted that with respect to the block at the last time (the last block), a block at the subsequent time does not exist, and therefore data of the block at the subsequent time does not exist either. Therefore, an erasure is used for the data that not exist.

In addition, with respect to the block at the first time (the first block), a block at the preceding time does not exist, and therefore data of the block at the preceding time does not exist either. Therefore, an erasure is used for the data that not exist.

Thus, the reliability of the data of the first and last blocks is low. Therefore, it is preferable that, for example, known data be used for the first and last blocks, and the data of the first and last blocks be discarded on the receiving side, in other words, be prevented from being treated as normal receive data.

Incidentally, in the first example, the block 61 that includes data targeted for iterative decoding processing is composed of the block 60 that is targeted for obtaining the result of iterative decoding processing, and respective one blocks immediately before and after the block 60. However, the present invention is not limited to this example. The block 61 that includes data targeted for iterative decoding processing may be composed of, for example, the block 60, and respective two blocks immediately before and after the block 60. Configuring the block 61 to be composed of the block 60, and respective finite-length blocks immediately before and after the block 60 suffices. In this case, the number of blocks immediately before the block 60 may differ from the number of blocks immediately after the block 60.

However, according to the result of examination by the inventor, it is often the case that configuring the block 61 that includes data targeted for iterative decoding processing to be composed of the block 60 that is targeted for obtaining the result of iterative decoding processing, and respective one blocks immediately before and after the block 60 suffices. By configuring the block 61 that includes data targeted for iterative decoding processing to be composed only of the block 60 and respective one blocks immediately before and after the block 60, the time required for the iterative decoding processing can be shortened.

According to the first example, at least the following effects can be achieved:

(A1) One block that is targeted for obtaining the result of iterative decoding processing is subjected to the iterative decoding processing by using bit information included in the block and in respective finite-length blocks immediately before and after the block, and therefore the BICM-ID processing for data in which the sequence of bits has been rearranged across blocks used for symbol interleaving can be realized;

(A2) One block that is targeted for obtaining the result of iterative decoding processing is subjected to the iterative decoding processing by using bit information included in the block and in respective one blocks immediately before and after the block, and therefore the time required for the BICM-ID processing can be shortened; For example, when the BICM-ID processing is applied to a wireless communication method that uses convolutional interleaving and block interleaving in combination, the processing amount can be suppressed;

(A3) When data of bit information does not exist in blocks before and after the block that is targeted for obtaining the result of iterative decoding processing, an erasure is used as an alternative to the data that does not exist, and therefore it is possible to prevent a bad influence from being exerted on the processing result;

(A4) The deinterleaver is configured to include the symbol deinterleaver that handles the output of the demodulator to return the sequence of symbols in a block, and the convolutional deinterleaver that subjects the output from the symbol deinterleaver to the parallel/serial conversion, and returns the sequence of bits to the original state, and therefore the deinterleaver can be easily realized;

(A5) The convolutional deinterleaver is configured to be provided with the delay device that delays at least one bit among bits that are parallel-output from the symbol deinterleaver, and the parallel/serial converter that subjects the parallel output from the delay device to serial conversion, and therefore the convolutional deinterleaver can be easily realized; (A6) The delay device is configured to make a delay so as to return the sequence of bits that has been rearranged in the interleave processing on the transmission side, and therefore the convolutional deinterleaver can be easily realized; and (A7) At least bit information of the first block and the last block among blocks that are targeted for obtaining the result of iterative decoding processing is prevented from being treated as normal receive data, and therefore the reliability of data of the result of the iterative decoding processing can be improved.

Second Example

Next, a second example of the present embodiment will be described.

Figure 8:
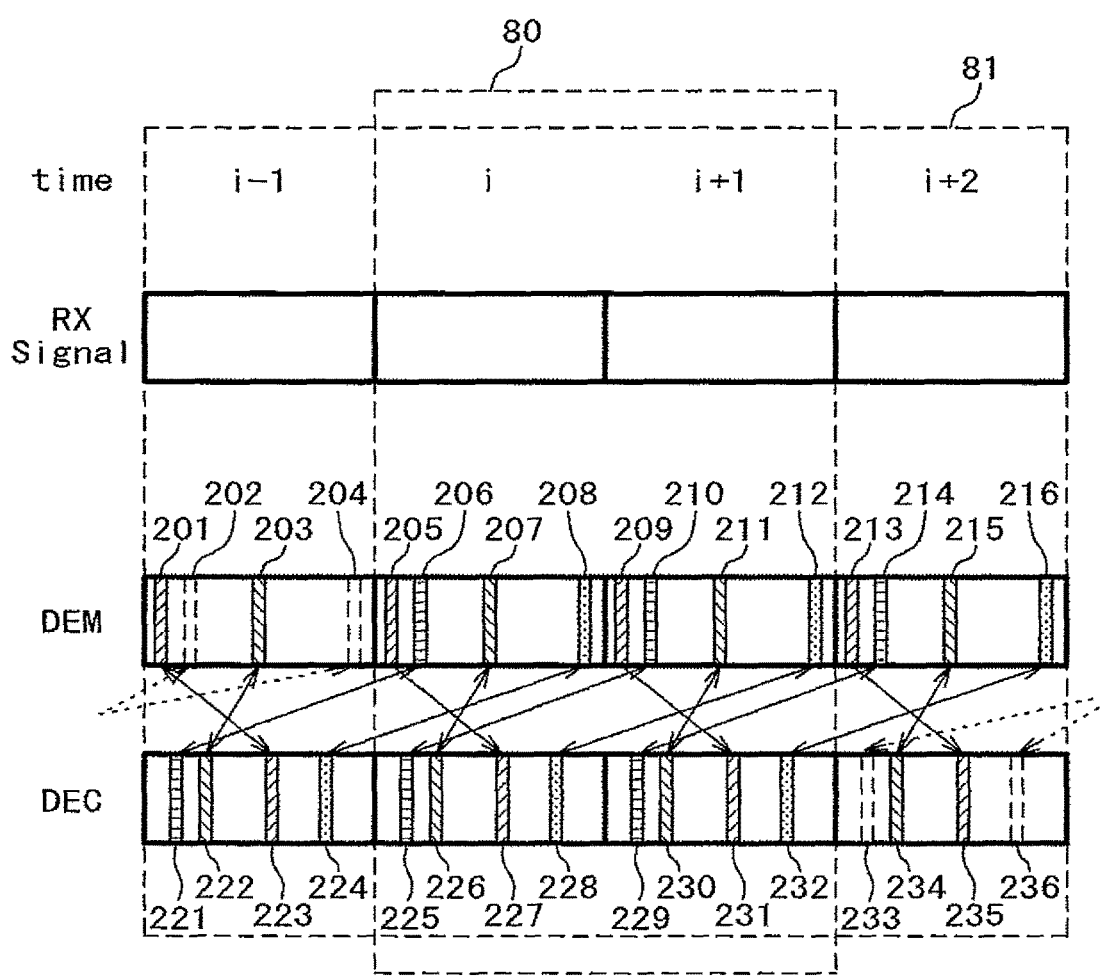
FIG. 8 is a drawing illustrating processing procedures of the BICM-ID method in a second example.

FIG. 8 is a drawing illustrating processing procedures of the BICM-ID method in the second example, and illustrates a case where the number of blocks 80 that are targeted for obtaining the result of iterative decoding processing is two or more. In the example shown in FIG. 8, the blocks 80 are composed of two blocks in total, the i block and the (i+1) block. However, the blocks 80 may be composed of three blocks or more.

Reference numeral 81 denotes blocks each including data targeted for iterative decoding processing. In the example shown in FIG. 8, reference numeral 81 corresponds to four blocks in total, the (i−1) block to the (i+2) block. In the example shown in FIG. 8, respective one blocks immediately before and after the blocks 80 that are targeted for obtaining the result of iterative decoding processing are added to the blocks 80, thereby composing the block 81. However, as described in the first example, respective two or more blocks immediately before and after the blocks 80 may be added to the blocks 80 to compose the block 81.

In the second example, after received signals at the time (i−1) to the time (i+2) are stored, two blocks 80 that are targeted for obtaining the result of iterative decoding processing are subjected to the iterative decoding processing by using bit information included in the blocks 80 and in respective one blocks immediately before and after the blocks 80. In this case, bit information that is not included in the blocks 80 and in the respective one blocks immediately before and after the blocks 80 is not used for the iterative decoding processing.

In the iterative processing, bit information of the blocks 81, the (i−1) block to the (i+2) block, which are four blocks in total, is exchanged between the decoder 17 and the demodulator 15. When finite-length blocks are subjected to iterative decoding processing in this manner, data having no bit information (data 202, 204, 233, 236 shown in FIG. 8) partially emerges in respective blocks immediately before and after the blocks 80 that are targeted for obtaining the result of the iterative decoding processing. However, it is preferable that a publicly-known erasure be used for the data so as to prevent a large influence from being exerted on the processing result.

In the example shown in FIG. 8, first of all, receive data of the (i−1) block to the (i+2) block is stored, and the receive data is demodulated by the demodulator 15. Next, the respective results of demodulating the data of the (i−1) block to the (i+2) block are output to the decoder 17, in this order, through the deinterleaver 16. In other words, deinterleave processing by the deinterleaver 16 is performed on a block basis, and the result is output to the decoder 17. In this case, with respect to the demodulation processing of the (i−1) block, the data 202, 204 do not exist in the bit information in the (i−1) block, and therefore erasures are used as the data 202, 204.

The decoder 17 performs decoding processing by using the results of demodulating the data of the (i−1) block to the (i+2) block, the results having been obtained through the deinterleaver 16. Next, the respective results of decoding the data of the (i−1) block to the (i+2) block are output to the demodulator 15, in this order, through the interleaver 18. In other words, interleave processing by the interleaver 18 is performed on a block basis, and the result is output to the demodulator 15. In this case, with respect to the decoding processing of the (i+2) block, the data 233, 236 do not exist in the bit information in the (i+2) block, and therefore erasures are used as the data 233, 236.

Next, the demodulator 15 performs demodulation processing by using the results of decoding the data of the (i−1) block to the (i+2) block, the results having been obtained through the interleaver 18. Thus, after the iterative decoding processing is performed a plurality of times, bit information of the blocks 80 that are targeted for obtaining the result of the iterative decoding processing is obtained.

Thus, in the case of the second example as well, bit information included in the block 81 that is formed by adding, to the blocks 80 that are targeted for obtaining the result of iterative decoding processing, at least respective one blocks immediately before and after the blocks 80, is used for the iterative decoding processing. By increasing a block length of blocks targeted for obtaining the result of iterative decoding processing, although the hardware scale required for performing the iterative decoding processing once becomes larger, a length ratio between the blocks 80 that are targeted for obtaining the result of the iterative decoding processing and the blocks 81 used for the iterative decoding processing becomes smaller, thus resulting in a decrease in overhead in the iterative decoding processing, which enables to reduce the computation amount.

According to the second example, at least the following effect can be achieved: (B1) The number of blocks that are targeted for obtaining the result of iterative decoding processing is configured to be two or more, and therefore the computation amount of the iterative decoding processing can be reduced.

Third Example

Next, a third example of the present embodiment will be described.

In the first and second examples, the BICM-ID method is realized by using, for iterative decoding processing, bit information that is included in at least respective one blocks immediately before and after the block targeted for obtaining the result of the iterative decoding processing. In the third example, there is provided a memory (storage unit) that stores a processing result of at least one block immediately before a block targeted for obtaining the result of iterative decoding processing, and for bit information related to the preceding block, the processing result stored in the memory is referred to.

Figure 9:
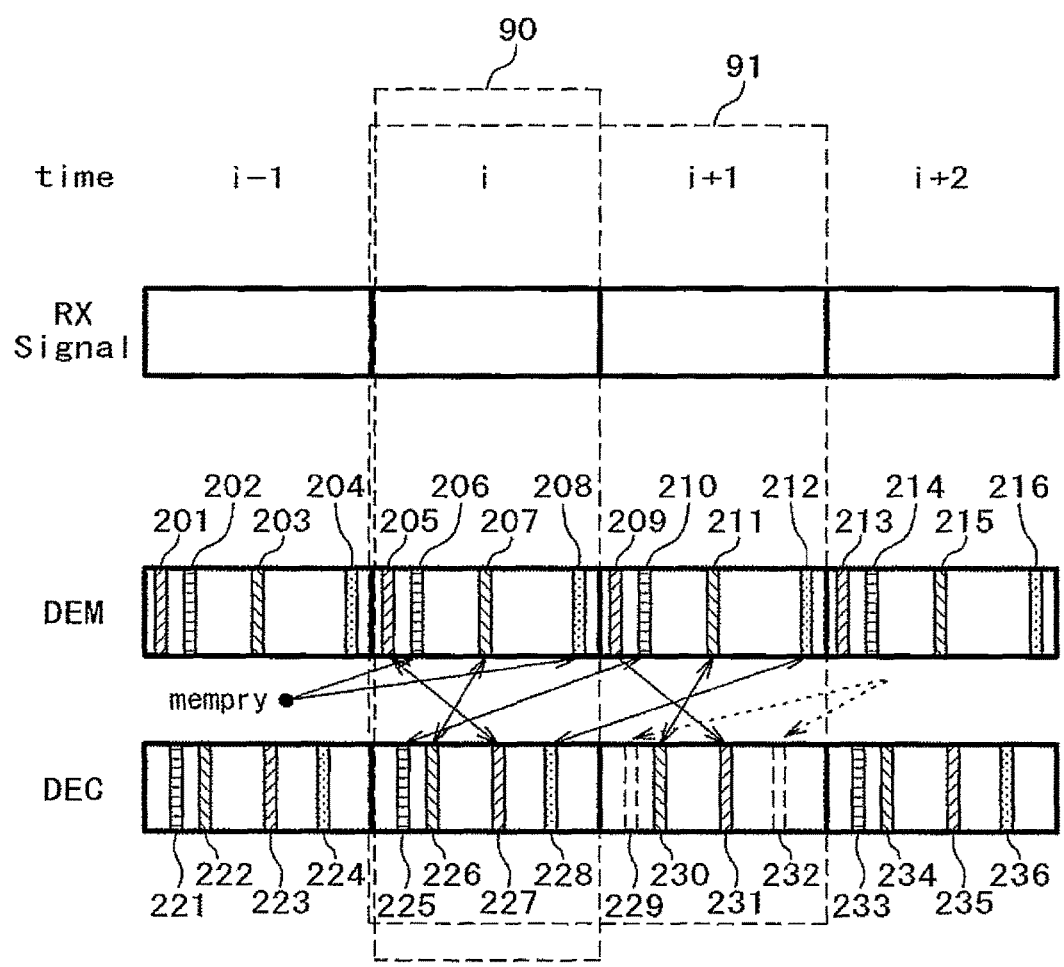
FIG. 9 is a drawing illustrating processing procedures of the BICM-ID method in a third example.

FIG. 9 is a drawing illustrating processing procedures of the BICM-ID method in the third example. As shown in FIG. 9, in the third example, bit information that is included in one block immediately before a block 90 targeted for obtaining the result of iterative decoding processing is stored, and blocks 91 that include data targeted for the iterative decoding processing are composed of the block 90, and one block immediately after the block 90. In addition, when the iterative decoding processing is performed, the stored bit information of the immediately preceding block is used.

Reference numeral 91 denotes blocks each including data targeted for iterative decoding processing. In the example shown in FIG. 9, reference numeral 91 corresponds to two blocks in total, the i block and the (i+1) block. In the example shown in FIG. 9, one block immediately after the block 90 that is targeted for obtaining the result of iterative decoding processing is added to the block 90, thereby composing the block 91. However, two or more blocks immediately after the block 90 may be added to the block 90 to compose the block 91.

In the third example, after received signals at the time i to the time (i+1) are stored, the one block 90 that is targeted for obtaining the result of iterative decoding processing is subjected to the iterative decoding processing by using bit information included in the block 90 and in the one block immediately after the block 90, and the bit information stored in the memory (bit information included in the one block immediately before the block 90). In this case, bit information that is included in blocks other than the block 90 and other than the one block immediately after the block 90, and bit information other than the bit information stored in the memory, are not used for the iterative decoding processing.

In the iterative processing, the bit information of the blocks 91, the i block and the (i+1) block, which are two blocks in total, and the bit information of the (i−1) block stored in the memory, are exchanged between the decoder 17 and the demodulator 15. In this case, with respect to bit information of respective one blocks immediately before and after the block 90 that is targeted for obtaining the result of iterative decoding processing, data having no bit information (data 229, 232, etc. shown in FIG. 9) partially emerges. However, it is preferable that a publicly-known erasure be used for the data so as to prevent a large influence from being exerted on the processing result.

More specifically, first of all, receive data of the i block and the (i+1) block is stored, and the receive data is then demodulated by the demodulator 15. Next, the respective results of demodulating the data of the i block and the (i+1) block are output to the decoder 17, in this order, through the deinterleaver 16. In other words, deinterleave processing by the deinterleaver 16 is performed on a block basis, and the result is output to the decoder 17. In this case, with respect to the demodulation processing of the i block, the data 206, 208 do not exist in the bit information in the i block. However, the data 206, 208 are obtained from the bit information of the (i−1) block stored in the memory.

The decoder 17 performs decoding processing by using the results of demodulating the data of the i block and the (i+1) block, the results having been obtained through the deinterleaver 16. Next, the respective results of decoding the data of the i block and the (i+1) block are output to the demodulator 15, in this order, through the interleaver 18. In other words, interleave processing by the interleaver 18 is performed on a block basis, and the result is output to the demodulator 15. In this case, with respect to the decoding processing of the (i+1) block, the data 229, 232 do not exist in the bit information in the (i+1) block, and therefore erasures are used as the data 229, 232.

Next, the demodulator 15 performs demodulation processing by using the results of decoding the data of the i block and the (i+1) block, the results having been obtained through the interleaver 18. Thus, after the iterative decoding processing is performed a plurality of times, bit information of the block 90 that is targeted for obtaining the result of the iterative decoding processing is obtained.

Thus, in the third example, blocks used for iterative processing are the blocks 91 that are composed of the block targeted for obtaining the result of iterative decoding processing, and at least one preceding block in terms of time. In the example shown in FIG. 9, when processing of the i block is performed, the processing result related to the (i−1) block has already been obtained, and stored in the memory at the immediately preceding time. Therefore, for the data 206, 208 of the bit information about the (i−1) block, the processing result of the preceding block stored in the memory is referred to.

This technique requires a memory for storing bit information included in at least one block at the immediately preceding time. However, blocks required for the iterative processing are the i block and the (i+1) block, which are two blocks in total. In other words, the number of blocks used for the iterative processing is smaller than that in the first example, and therefore the computation amount of the iterative decoding processing can be reduced in comparison with the first example.

According to the third example, at least the following effect can be achieved:

(B1) Bit information that is included in one block immediately before the block 90 targeted for obtaining the result of iterative decoding processing is stored, and with respect to bit information about the immediately preceding block, the processing result stored in the memory is used. Therefore, the number of blocks required for the iterative processing can be reduced, and the computation amount of the iterative decoding processing can be reduced in comparison with the first example.

Fourth Example

Next, a fourth example of the present embodiment will be described.

Figure 10:
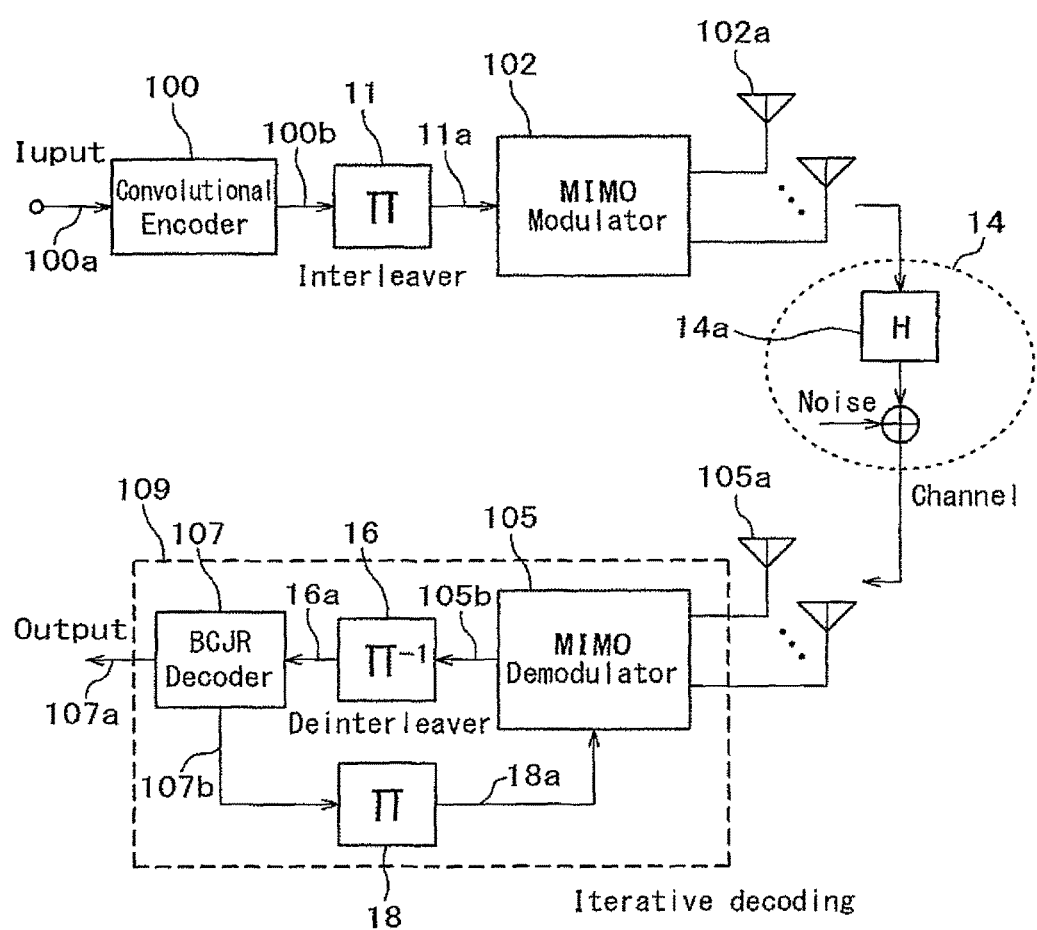
FIG. 10 is a diagram illustrating a configuration of a wireless communication system in a fourth example.

FIG. 10 is a diagram illustrating a configuration of a wireless communication system in the fourth example, and shows a configuration in which the present invention is applied to a wireless communication system that uses a MIMO (Multiple Input Multiple Output) technique.

As shown in FIG. 10, the configuration in the fourth example is the same as that of the BICM-ID shown in FIG. 1 with the exceptions that in a configuration of a transmitter, a publicly-known convolution encoder 100 is used as the encoder 10 shown in FIG. 1, a publicly-known MIMO modulator 102 is used as the modulator 12, and a plurality of antennas 102a are used as the antenna 12a, and in a configuration of a receiver, a plurality of antennas 105a are used as the antenna 15a, a publicly-known MIMO demodulator 105 is used as the demodulator 15, and a publicly-known BCJR decoder 107 is used as the decoder 17. The same components are denoted by the same reference numerals as those in FIG. 1.

In the transmitter, the convolution encoder 100 convolutionally encodes input bit information 100a, and outputs the convolutionally encoded bit information to the interleaver 11. The interleaver 11 performs interleave processing that randomly rearranges the sequence of bits across a plurality of blocks, and outputs bit information to the MIMO modulator 102. As described in the first example, the interleaver 11 is configured as a combination of the convolutional interleaver 20 that rearranges the sequence of bits, and the block interleaver 23 that rearranges the sequence of symbols.

In the receiver, the MIMO demodulator 105 subjects a received signal input from the antenna 105a to demodulation processing, and outputs bit information 105b, which is the processing result, to the deinterleaver 16. The deinterleaver 16 subjects the bit information 105b, which is the processing result, to deinterleave processing that returns the sequence of bit strings and the sequence of symbol strings, which have been rearranged by the interleaver 11, to the original states, and outputs bit information 16a, which is the processing result, to the BCJR decoder 107. The output 107b of the BCJR decoder 107 is subjected to interleave processing by the interleaver 18 again, and bit information 18a, which is the processing result, is supplied to the MIMO demodulator 105. The MIMO demodulator 105 performs the demodulation processing again by using the bit information 18a received from the BCJR decoder 107 through the interleaver 18. The iterative decoding processing unit 109 performs the BICM-ID processing in this manner.

Thus, by using the technique of the present invention in the wireless communication system having the configuration as shown in FIG. 10, in which the MIMO technique is used, and in which interleave processing that randomly rearranges the sequence of bits across blocks is performed, the BICM-ID processing can be applied to the wireless communication system.

FIG. 11 shows bit error rate characteristics (BER characteristics) obtained in a case where in the configuration shown in FIG. 10, a code having a coding rate of ½ and having a constraint length of 7 is used as a convolutional code of the convolutional encoder 100, and two transmission antennas, two receiving antennas, and QPSK modulation are used as the MIMO modulator 102 and the MIMO demodulator 105.

In FIG. 11, characteristics 111 indicate BER characteristics in the prior art, in other words, BER characteristics obtained when BICM-ID is not applied. Characteristics 112 indicate BER characteristics obtained when BICM-ID is applied, in other words, BER characteristics obtained when the technique of the present invention is used. The characteristics 112 indicate BER characteristics obtained in the case (the first example) where respective one blocks immediately before and after the block that is targeted for iterative decoding processing are used in an iterative processing unit. It can be understood from FIG. 11 that by using the technique of the present invention, a gain of approximately 5 dB can be obtained as the result of the iterative processing.

According to the fourth example, at least the following effect can be achieved:

(D1) By using the MIMO technique, BICM-ID processing can also be applied to the wireless communication system in which the sequence of bits is rearranged across blocks used for symbol interleaving.

It should be noted that the present invention is not limited to the above-described embodiment, and it is needless to say that the present invention can be modified in various ways within the scope that does not deviate from the gist of the invention.

REFERENCE SIGNS LIST

10 Encoder
11 Interleaver
12 Modulator
12a Antenna
14 Wireless propagation path (wireless channel)
14a Channel information
15 Demodulator
15a Antenna
15b Bit information (first extrinsic information)
16 Deinterleaver
16a Bit information (second extrinsic information)
17 Decoder
17a Final decoder output
17b Bit information (third extrinsic information)
18 Interleaver
18a Bit information (fourth extrinsic information)

19 Iterative decoding processing unit
20 Convolutional interleaver
21 Serial/parallel converter
22 Delay device
23 Block interleaver (symbol interleaver)
30 Block deinterleaver (symbol deinterleaver)
31 Convolutional deinterleaver
32 Delay device
33 Parallel/serial converter
40 Data targeted for iterative decoding processing
41 Block (unit of processing of symbol interleaving)
42 Symbol
50 Data targeted for iterative decoding processing
60 Block targeted for obtaining the result of iterative decoding processing
61 Blocks each containing data targeted for iterative decoding processing
70 Block targeted for obtaining the result of iterative decoding processing
71 Blocks each containing data targeted for iterative decoding processing
80 Blocks targeted for obtaining the result of iterative decoding processing
81 Blocks each containing data targeted for iterative decoding processing
90 Block targeted for obtaining the result of iterative decoding processing
91 Blocks each containing data targeted for iterative decoding processing
100 Convolutional encoder
102 MIMO modulator
102a Antenna
105 MIMO demodulator
105a Antenna
107 BCJR decoder
109 Iterative decoding processing unit
111 BER characteristics in the prior art
112 BER characteristics obtained when BICM-ID is applied
201 to 216, 221 to 236 Bit information

The invention claimed is:

1. A receiver,
an antenna that receives a wireless signal that has been encoded, has been subjected to a first interleave processing including symbol interleave processing that rearranges a sequence of a plurality of symbols, and has been modulated and transmitted in units of symbols, a sequence of bits being rearranged, in the first interleave processing, across blocks in which the symbol interleave processing is performed;
a demodulator that performs demodulation processing of the wireless signal by using a priori information, and outputs first bit information;
a deinterleaver that subjects the first bit information to deinterleave processing that returns the sequence of bits rearranged by the first interleave processing to an original state, and outputs second bit information;
a decoder that decodes the second bit information, and outputs third bit information;
an interleaver that subjects the third bit information to second interleave processing that processes reverse to the deinterleave processing, and outputs fourth bit information; and
an iterative decoding processer that performs iterative decoding processing by inputting the fourth bit information into the demodulator as the priori information,
wherein in response to the iterative decoding processing being performed, bit information of finite-length blocks is used, wherein the finite-length blocks includes at least respective blocks immediately before and after a result obtaining target block that is a target for obtaining a result of the iterative decoding processing.

2. The receiver according to claim 1,
wherein in further response to the iterative decoding processing being performed, bit information of the result obtaining target block and bit information of respective one blocks immediately before and after the result obtaining target block are used, and bit information of blocks other than the result obtaining target block, and other than the respective one blocks immediately before and after the result obtaining target block is not used.

3. The receiver according to claim 1,
wherein bit information of an immediately preceding block that is a block immediately before the result obtaining target block is stored, and in further response to the iterative decoding processing being performed, bit information of the immediately preceding block is used.

4. The receiver according to claim 1,
wherein the result obtaining target block is composed of a plurality of blocks.

5. The receiver according to claim 1,
wherein in response to data of bit information not existing in the finite-length blocks, an erasure process is used as an alternative to the data that does not exist.

6. The receiver according to claim 1,
wherein the receiver does not treat, as normal receive data, at least bit information of a first block and a last block among the result obtaining target blocks.

7. The receiver according to claim 1, wherein the deinterleaver includes:
a symbol deinterleaver that handles the first bit information to return the sequence of symbols rearranged by the first interleave processing to an original state, and
a convolutional deinterleaver that subjects an output from the symbol deinterleaver to parallel/serial conversion, and that returns the sequence of bits rearranged by the first interleave processing to an original state.

8. The receiver according to claim 7, wherein the convolutional deinterleaver includes:
a delay device that delays at least one bit among bits parallel-output from the symbol deinterleaver, and
a parallel/serial converter that subjects a parallel output from the delay device to serial conversion.

9. The receiver according to claim 8, wherein the delay device makes the delay to return the sequence of bits rearranged in the first interleave processing to an original state.

10. A wireless communication system comprising:
a transmitter that:
transmits a wireless signal,
encodes bit information to be transmitted,
performs first interleave processing that includes symbol interleave processing that rearranges a sequence of a plurality of symbols in one block,
performs bit interleave processing that rearranges a sequence of bits across the blocks, and
modulates a wireless signal in units of symbols to transmit the wireless signal;
a receiver comprising:
an antenna that receives the wireless signal transmitted from the transmitter, a demodulator that performs demodulation processing of the wireless signal by using a priori information, and outputs first bit information, a deinterleaver that subjects the first bit information to deinterleave processing that returns the sequence of bits rearranged by the first interleave processing to an original state, and outputs second bit information, a decoder that decodes the second bit information, and outputs third bit information, and an interleaver that subjects the third bit information to second interleave processing that is processing reverse to the deinterleave processing, and outputs fourth bit information; and an iterative decoding processor that performs iterative decoding processing inputting the fourth bit information into the demodulator as the priori information, wherein in response to the iterative decoding processing being performed, bit information of finite-length blocks is used, wherein the finite-length blocks including at least respective blocks immediately before and after a result obtaining target block that is a target for obtaining a result of the iterative decoding processing.

11. A wireless communication method comprising:

performing, after encoding, first interleave processing that includes symbol interleave processing that rearranges a sequence of a plurality of symbols and bit interleave processing that rearranges a sequence of bits across blocks at the time of the symbol interleave processing, and modulating a wireless signal in units of symbols to transmit the wireless signal;

performing demodulation processing of the wireless signal by using a priori information, and outputting first bit information;

deinterleave processing the first bit information to return the sequence of bits rearranged by the first interleave processing to an original state, and outputting second bit information;

decoding the second bit information, and outputting third bit information;

second interleave processing the third bit information that is processing reverse to the deinterleave processing, and outputting fourth bit information; and performing iterative decoding processing by using the fourth bit information in the demodulation processing the priori information, and when the iterative decoding processing is performed, bit information of finite-length blocks is used, the finite-length blocks including at least respective blocks immediately before and after a result obtaining target block that is a target for obtaining a result of the iterative decoding processing.

* * * * *